US010263123B2

(12) United States Patent
Kim et al.

(10) Patent No.: US 10,263,123 B2
(45) Date of Patent: Apr. 16, 2019

(54) ELECTROSTATIC DISCHARGE DEVICE AND METHOD OF FABRICATING THE SAME

(71) Applicant: Magnachip Semiconductor, Ltd., Cheongju-si (KR)

(72) Inventors: Ho Hyun Kim, Seoul (KR); Ha Yong Yang, Cheongju-si (KR); Jeong Hwan Park, Gumi-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 39 days.

(21) Appl. No.: 14/734,156

(22) Filed: Jun. 9, 2015

(65) Prior Publication Data

US 2016/0141429 A1    May 19, 2016

(30) Foreign Application Priority Data

Nov. 18, 2014    (KR) .................. 10-2014-0160505

(51) Int. Cl.

| | | |
|---|---|---|
| *H01L 21/283* | (2006.01) | |
| *H01L 21/822* | (2006.01) | |
| *H01L 27/02* | (2006.01) | |
| *H01L 29/866* | (2006.01) | |
| *H01L 29/861* | (2006.01) | |
| *H01L 29/66* | (2006.01) | |
| *H01L 29/43* | (2006.01) | |
| *H01L 29/06* | (2006.01) | |

(52) U.S. Cl.
CPC ........ *H01L 29/866* (2013.01); *H01L 27/0255* (2013.01); *H01L 29/0649* (2013.01); *H01L 29/6609* (2013.01); *H01L 29/861* (2013.01)

(58) Field of Classification Search
CPC ............. H01L 27/0255; H01L 29/8611; H01L 29/866; H01L 29/0649; H01L 29/6609; H01L 29/861; H01L 27/0259; H01L 27/0262; H01L 27/0814; H01L 29/87; H01L 21/283; H01L 21/822; H01L 27/0248; H01L 29/1016; H01L 29/43; H01L 29/456; H01L 29/66371; H01L 29/7412

See application file for complete search history.

(56) References Cited

U.S. PATENT DOCUMENTS

| | | | | |
|---|---|---|---|---|
| 4,652,895 | A * | 3/1987 | Roskos | ............... H01L 27/0761 257/551 |
| 5,880,511 | A | 3/1999 | Yu et al. | |
| 6,015,999 | A | 1/2000 | Yu et al. | |
| 6,441,437 | B1 * | 8/2002 | Gossner | ............. H01L 27/0248 257/355 |
| 6,915,999 | B2 | 7/2005 | Wang | |
| 7,579,632 | B2 | 8/2009 | Salih et al. | |

(Continued)

*Primary Examiner* — Mark W Tornow
*Assistant Examiner* — Priya M Rampersaud
(74) *Attorney, Agent, or Firm* — NSIP Law

(57) ABSTRACT

Provided are an electrostatic discharge (ESD) device and method of fabricating the same where the ESD device is configured to prevent electrostatic discharge which can be a cause to product failure. More particularly, the ESD device provided includes a Zener diode and a plurality of PN diodes by improving the architecture of an area wherein a Zener diode is configured compared to alternatives, to provide improved functionality when protecting against ESD events.

17 Claims, 7 Drawing Sheets

(56) References Cited

U.S. PATENT DOCUMENTS

| | | | |
|---|---|---|---|
| 8,732,264 B2 | 5/2014 | Decker et al. | |
| 2009/0079032 A1* | 3/2009 | Marreiro | H01L 27/0814 257/597 |
| 2009/0206439 A1* | 8/2009 | Kitajima | H01L 27/0255 257/487 |
| 2010/0006889 A1* | 1/2010 | Marreiro | H01L 27/0255 257/106 |
| 2011/0266592 A1* | 11/2011 | Hawe | H01L 27/0255 257/109 |
| 2014/0167101 A1* | 6/2014 | Bobde | H01L 27/0259 257/112 |

* cited by examiner

ELECTROSTATIC DISCHARGE DEVICE AND METHOD OF FABRICATING THE SAME

CROSS-REFERENCE TO RELATED APPLICATION(S)

This application claims the benefit under 35 USC 119(a) of Korean Patent Application No. 10-2014-0160505 filed on Nov. 18, 2014 in the Korean Intellectual Property Office, the entire disclosure of which is incorporated herein by reference for all purposes.

BACKGROUND

1. Field

The following description relates to an electrostatic (ESD) discharge device and method of fabricating the same. Such a device is configured to prevent ESD, a cause of product failure.

The following description also relates to a transient voltage suppressor (TVS) for an electrostatic discharge and method of fabricating the same which can improve TVS and ESDs feature by enlarging an area wherein a Zener diode is formed so as to be larger than alternatives.

2. Description of Related Art

A transient voltage suppressor or (TVS) is a general classification of an array of devices that are designed to react to sudden or momentary overvoltage conditions, to avoid negative consequences of such conditions. One such common device used for this purpose is known as the transient voltage suppression diode that is simply a Zener diode designed to protect electronics device against overvoltages. A Zener diode is a diode that allows current to flow in the forward direction in the same manner as an ideal diode, but a Zener diode also permits current to flow in the reverse direction when the voltage is above a certain value, known as the breakdown voltage.

Alternative semiconductor industry manufactured electrostatic discharge (ESD) protection devices use various methods and structures. In regards to international specifications, an example may be an ESD device standard that is able to respond to a high input voltage and current within one nanosecond. Such an example ESD device may correspond to a level 2 of IEC 61000-4-2 in International Electrotechnical Commission (IEC) guidelines and standards.

Some alternative ESD devices disclose structures wherein the ESD devices protect against effects of an ESD by employing a Zener diode and a P-N junction diode. A P-N junction diode occurs at a boundary between p-type and n-type doped semiconductors, and acts as a diode in that such a diode conducts in one direction. Generally, alternative ESD devices with acute breakdown voltage features have a problem of low capacitance. Such an acute breakdown voltage feature is required to provide low clamp voltages for an ESD device. In most cases, ESD devices generally have a greater capacitance than 1-6 pF. Such a type of device with large capacitance limits a response time of an ESD device.

Additionally, alternative ESD devices with relatively large capacitance value have slow response speeds and have a limitation in controlling their operation with a certain size clamp voltage in case a positive or a negative ESD event occurs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples overcome the above disadvantages and other disadvantages not described above. However, the present examples are not required to overcome the disadvantages described above.

The examples are suggested to solve said problem and to provide an ESD device and method of fabricating the same with an improved diode featuring a relatively low capacitance value compared to alternatives.

In one general aspect, an electrostatic discharge (ESD) device includes a first conductivity-type semiconductor substrate, a second conductivity-type epi-layer situated on the semiconductor substrate, a second conductivity-type semiconductor layer situated on a region among regions located between the semiconductor substrate and the epi-layer, a second conductivity-type Zener region having a higher dopant concentration than the semiconductor layer, and overlapping on the semiconductor layer and the semiconductor substrate, situated in a region having a greater depth than that of the semiconductor layer, a first conductivity-type first doping region situated on the upper side of the epi-layer and an upper region of the semiconductor layer, a first blocking structure surrounding the semiconductor layer, the Zener region, and the first doping region, and a second conductivity-type second doping region situated on the upper side of the epi-layer at an exterior region of the first blocking structure, wherein the semiconductor layer overlaps with the first doping region and the Zener region does not overlap with the first doping region and the second doping region.

The doping concentration of the semiconductor layer may be greater than the doping concentration of the epi-layer.

The doping concentration of the Zener region may be greater than the doping concentration of the semiconductor layer.

The Zener region may include vertical structures that overlap the semiconductor layer and semiconductor substrate that are isolated from one another by being spaced evenly across the semiconductor layer.

The lower side of the Zener region may have a wave shape.

The ESD device may further include a third doping region of a second conductivity type situated on an upper side of the epi-layer and an upper region of the semiconductor layer.

Two of the first doping regions may be situated to be spaced apart from each other and the third doping region may be situated between the two of the first doping regions.

The ESD device may further include a second blocking structure that surrounds the second doping region.

The ESD device may further include an insulator layer situated on a region of the upper side of the epi-layer and an electrode situated on the insulator layer that electronically links the first doping region and the second doping region.

In another general aspect, method of manufacturing an electrostatic discharge (ESD) device includes forming a semiconductor layer of a second conductivity-type situated on one region of an upper side of a first conductivity-type semiconductor substrate, forming a second conductivity-type Zener region, wherein the Zener region overlaps with the semiconductor layer and the semiconductor substrate, forming a first doping region of a first conductivity-type situated on an upper side of an epi-layer of the upper region of the semiconductor layer, forming a second doping region of a second conductivity-type on an upper side of epi-layer lacking a semiconductor layer, and forming a first isolation structure between the first doping region and the second doping region, wherein the semiconductor layer overlaps with the first doping region, and wherein the Zener region does not overlap with the first doping region and the second doping region.

Two doping regions may be formed through the operations for forming the first doping region, and the method may further includes forming a second conductivity type third doping region on an upper side of the epi-layer at a region between the two doping regions.

The step of forming the Zener region may include forming Zener regions through a mask process comprising masking patterns for the Zener regions.

A doping concentration of the Zener region may be greater than a doping concentration of the semiconductor layer.

The forming of the first isolation structure may include forming a first separation structure, forming a trench that passes through the epi-layer from an upper side of the epi-layer and extends into a part of the semiconductor substrate, and forming an insulator in the interior of the trench.

The first separation structure may surround the first doping region.

The method of manufacturing an ESD device may further include forming a second separation structure surrounding the second doping region.

In another general aspect, an ESD device includes a semiconductor layer situated between a semiconductor substrate and an epi-layer situated on the semiconductor substrate, a Zener region having a higher dopant concentration than the semiconductor layer, and overlapping on the semiconductor layer and the semiconductor substrate, situated in a region having a greater depth than that of the semiconductor layer, a first doping region situated on the upper side of the epi-layer and an upper region of the semiconductor layer, a first blocking structure surrounding the semiconductor layer, the Zener region, and the first doping region, and a second doping region situated on the upper side of the epi-layer at an exterior region of the first blocking structure, wherein the epi-layer, the semiconductor layer, the Zener region, and the second doping region are of an opposite conductivity-type to that of the semiconductor substrate and the first doping region.

The semiconductor layer may overlap with the first doping region and the Zener region may not overlap with the first doping region and the second doping region.

The doping concentration of the semiconductor layer may be greater than the doping concentration of the epi-layer.

The doping concentration of the Zener region may be greater than the doping concentration of the semiconductor layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
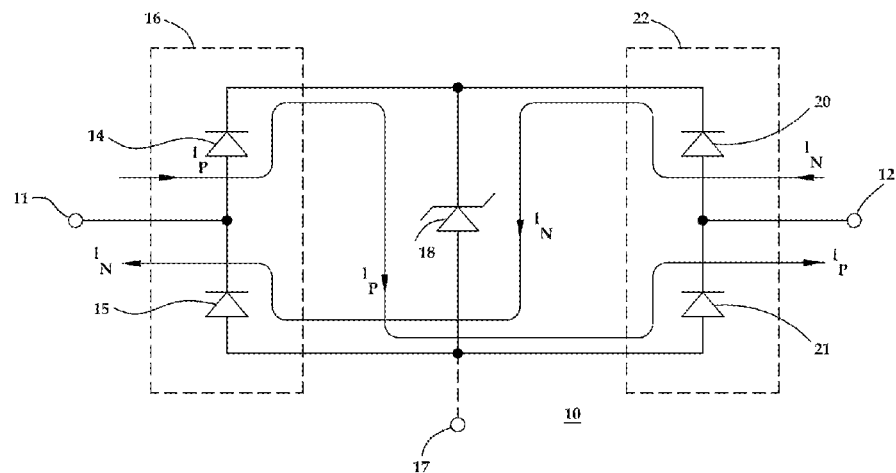
FIG. 1 is a circuit diagram of an ESD device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in greater detail with reference to the accompanying drawings.

In the following description, same drawing reference numerals are used for the same elements, even in different drawings. The matters defined in the description are provided to assist in a comprehensive understanding of the present examples. Accordingly, it is apparent that other examples are potentially carried out without those specifically defined matters. Also, well-known functions or constructions are not described in detail to avoid obscuring the discussion of examples with unnecessary details.

While expressions such as "first" or "second" are used to refer to various elements, the elements are not intended to be limited by these expressions. Such expressions are used only for the purpose of distinguishing one element from the other, and are not intended to imply a specific relationship between elements unless specifically specified.

The expressions are used herein only for the purpose of explaining specific embodiments and are not intended to limit the present invention. Additionally, an expression in singular form is intended to encompass the plural meaning, unless otherwise specified. Throughout the description, the expression "comprise" or "have" is used only to designate the existence of characteristic, number, step, operation, element, component or a combination thereof which are described herein, but is not intended to preclude a possibility of existence of one or more of the other characteristics, numbers, steps, operations, elements, components or combinations of these or additional aspects and features.

Spatial words such as below, beneath, lower, above and upper are used to conveniently recite a correlation between one element or feature with other elements or features as illustrated in the drawing. When spatial terminology is used with a direction as illustrated in the drawing, if the illustrated element is upside down, the element that was recited as below and beneath is intended to be considered as being above or upper of another element. Thus, examples below potentially include all the direction of below and above. An element can be aligned in another direction thereby spatial words can be interpreted according to the alignment. It is also to be noted that when one element is described as being situated upon another element, this usage is intended to indicate that the two elements are adjacent to one another, and in some examples the elements are parts of an integrated whole. However, in other examples such elements are separate elements that are distinct, but are directly proximate to one another. Also, when an element is situated on another element, in some examples, that element is physically above the other element, but other examples do not have such a requirement.

Moreover, words such as "a first conductive-type" and "a second conductive-type" are intended to indicate conductive-types which are opposite to each other such as P-type or N-type. Respective examples illustrated and recited herein include complementary examples thereof, in which these types of semiconductors are switched. In the first example, a first conductive-type is P-type and a second conductive-type is N-type.

FIG. 1 is a circuit diagram relating to an ESD device according to an example. As illustrated in the example of FIG. 1, an ESD device 10 includes two terminals 11, 12 and conducts ESD protective function in two ways between the two terminals 11, 12. Thus, the first terminal 11 and the second terminal 12 operate as an input terminal, output terminal or an output terminal, input terminal configuration depending on the situation and context.

Herein, the ESD device 10 comprises a transient voltage suppressor (TVS) which is an array of devices that are designed to react to sudden or momentary overvoltage conditions. One such common device used for this purpose is known as the transient voltage suppression diode that is simply a Zener diode, as discussed above, designed to protect electronics device against overvoltages.

The ESD device 10 not only limits maximum voltage which generates the two terminals 11, 12 with clamp voltage of ESD device but also is capable of effectively controlling clamp voltage value by offering an improved breakdown voltage feature, compared to alternative ESD devices.

The ESD device 10 includes a plurality of steering diode channels, including a first steering diode channel 16 and a second steering diode channel 22. The first steering diode channel 16 includes a first steering diode 14 and a second steering diode 15, where an anode of the first steering diode 14 is commonly connected with cathode electrode of a first terminal 11 and a second steering diode 15. The second steering diode channel 22 includes a third steering diode 20 and a fourth steering diode 21, and an anode electrode of the third steering diode 120 is commonly connected to a cathode electrode of a second terminal 12 and a fourth steering diode 21.

In the example of FIG. 1, each of the first to a fourth steering diode 14, 15, 20, 21 include a diode with a low capacitance value and a Zener diode 18 is connected in parallel with the first steering diode channel 16 and a second steering diode channel 22. In other words, an anode electrode of the Zener diode 18 is commonly connected with an anode electrode of the second steering diode 15 and the fourth steering diode 21 and a cathode electrode of the Zener diode 18 is commonly connected with cathode electrode of the first steering diode 14 and the third steering diode 20.

When a positive electrostatic discharge event is input with the first terminal 11 into the ESD device 10, a relatively large positive voltage is applied to the first terminal 11 compared to the voltage applied to the second terminal 12. The positive voltage takes on a forward bias with respect to the first steering diode 14 and the fourth steering diode 21 and the Zener diode 18 takes on a reverse bias with respect to the second steering diode 15 and the third steering diode 20. When a voltage between the first terminal 11 and the second terminal 12 reaches a threshold voltage of the ESD device 10, positive current $I_P$ flows from the first terminal 11 and passing through the first diode 14, the Zener diode 18, and the fourth diode 21 into the second terminal 12. Here, a Zener voltage of the Zener diode 18 clamps maximum voltage between the two terminals 11, 12 based on a proper Zener voltage, because current flows differently once the proper Zener voltage is achieved.

When a negative electrostatic discharge event is input with the first terminal 11, a relatively large negative voltage is applied to the first terminal 11 compared to the second terminal 12. The negative voltage takes on a forward bias in regards to the second and the third steering diode 14, 21 and the Zener diode 18 becomes reverse biased in regards to the first and the fourth steering diode 14, 21. When a voltage between the first terminal 11 and the second terminal 12 reaches a threshold voltage of ESD device 10, a negative current $I_N$ flows from the second terminal 12 through the third diode 20, the Zener diode 18, and the second diode 15 into the first terminal 11. Herein, a Zener voltage of Zener diode 18 clamps maximum voltage that is configured between the two terminals 11, 12 into a proper Zener voltage, because current flows differently once the proper Zener voltage is achieved.

To illustrate a semiconductor structure relating to an ESD device of the present invention, reference is made to the examples FIG. 2 to FIG. 5.

Figure 2:
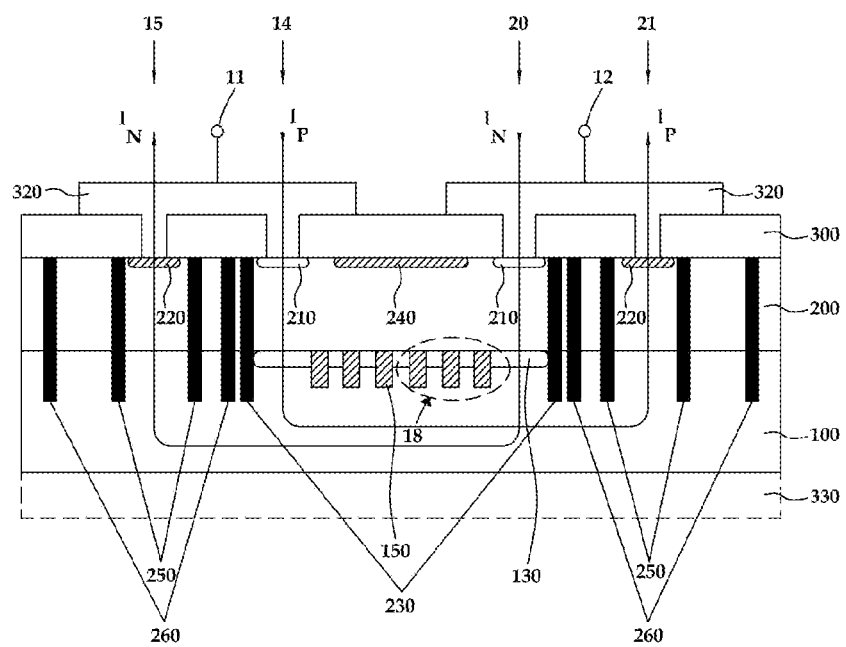
FIG. 2 is a cross-sectional view of an ESD device according to the example of FIG. 1.

FIG. 2 is a cross sectional view of an ESD device according to the example of FIG. 1. Diodes 14, 15, 20, 21 and Zener diode 18 illustrated in FIG. 1, are configured on a semiconductor substrate 100 as FIG. 2. An example indicates diode 14, 15, 20, 21 and Zener diode 18 using arrows for easier explanation.

As illustrated in the example of FIG. 2, an ESD device according to the present example includes a semiconductor substrate 100, epi-layer 200, semiconductor layer 130, Zener region 150, a first doping region 210, and a second doping region 220. In an example, the semiconductor substrate 100 is configured and doped with a P-type impurity so as to have more than a 1e19 atoms/cm$^3$ concentration and the epi-layer 200 is formed and doped for an N-type impurity to have more than 1e13 atoms/cm$^3$ of concentration.

More particularly, such an epi-layer 200 doped with N-type impurity is situated on an upper semiconductor substrate 100 doped with a P-type impurity. In an example, the semiconductor substrate 100 is configured to be doped so as to have a concentration of more than 1e19 atoms/cm$^3$ of a P-type impurity and the epi-layer 200 is configured to be doped so as to have more than 1e13 atoms/cm$^3$ of an N-type impurity.

Semiconductor layer 130, doped with an N-type impurity, is formed on one region between the regions of the semiconductor substrate 100 and the epi-layer 200, as discussed above. In an example, the semiconductor layer 130 is formed so as to have a higher impurity concentration than that of the epi-layer 200. For example, the semiconductor layer 130 is doped with an N-type impurity so as to have a 1e16-1e18 atoms/cm$^3$ concentration, which is chosen to exceed the impurity concentration of the epi-layer 200. Additionally, an example controls concentration of the semiconductor layer 130 in order to have a lower concentration than a Zener region 150. In FIG. 2, for easier illustration, it is indicated for the semiconductor layer 130 to be situated in the middle of the drawing.

In the example of FIG. 2, the Zener region 150 doped with N-type impurity is situated so as to overlap on such a semiconductor layer 130 and a semiconductor substrate 100. Also, in the example of FIG. 2, the Zener region 150 has a plurality of vertical structures that are configured to be isolated from one another and are spaced evenly apart from one another so as to overlap on the semiconductor layer 130 and semiconductor substrate 100. The Zener region 150 permeates relatively further into the direction of the semiconductor substrate 100 than that of an epi-layer 200 direction. Thus, this approach helps the Zener region 150 and the semiconductor substrate 100 and other diodes of a plurality of diodes 18 to be formed. The Zener region 150 is formed so as to have a dopant concentration of 1e18 to 1e20 atoms/cm$^3$. Such a concentration is chosen so as to at least be higher than the concentration semiconductor layer 130. Thus, the Zener diodes 18 are formed through Zener region 150.

Moreover, although the Zener region 150 is formed in parallel with the semiconductor layer 130, it is formed thicker than the semiconductor layer 130. Since the Zener region is formed to be relatively thick, it has an effect of enlarging a Zener diode area. Moreover, the Zener region 150 is a region that does not overlap with the first doping region 210 and the second doping region 220.

FIG. 2 is a cross sectional view of an ESD device which includes the Zener region 150 according to the example of FIG. 1. FIG. 2 illustrates a feature of the Zener region as taking the form of a plurality of vertical structures but the actual Zener region 150 is formed in various ways in various examples. FIGS. 3A-3E provide additional details regarding these variants.

FIGS. 3A-3E are diagrams of examples of top views in regards to the Zener region 150 which are applicable to examples.

As illustrated in FIGS. 3A-3E, the Zener region 150 is potentially formed in various forms in terms of an ESD device according to the examples.

Figure 3A:
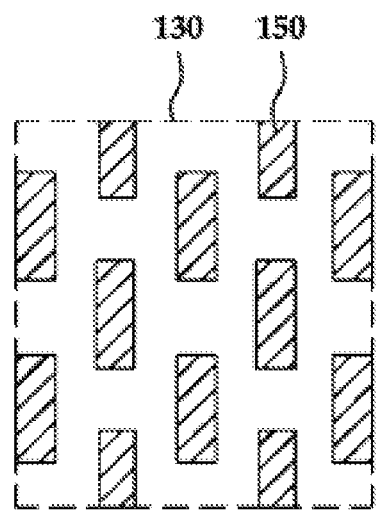
FIGS. 3A-3E are top views of examples of a Zener region which is applicable to an example ESD device.
Figure 3B:
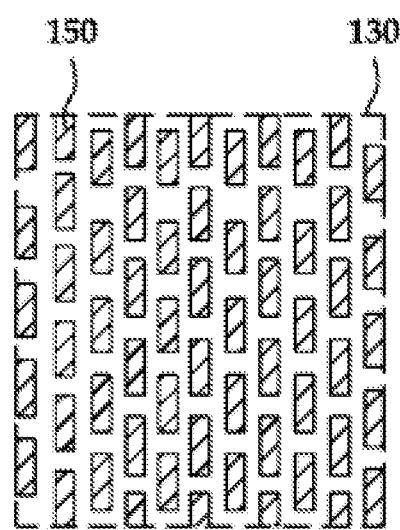

For example, the Zener region 150 is formed in a bar shape of certain size as in the example of FIG. 3A and the bar form is potentially configured to align in a certain pattern. Moreover, as in the example of FIG. 3B, a bar form smaller than FIG. 3A is potentially configured to be aligned more densely.

Figure 3C:
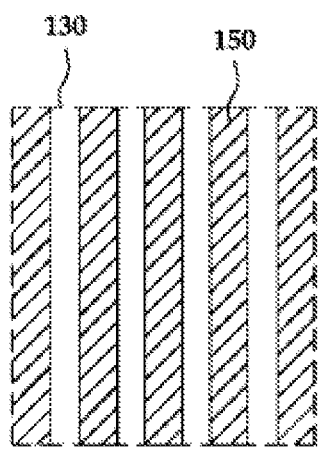

In another example, like the example of FIG. 3C, the Zener region 150 is potentially formed in a stripe shape, wherein a rectangular shape having one side longer than another side is spaced evenly apart on an N-type injected region.

Figure 3D:
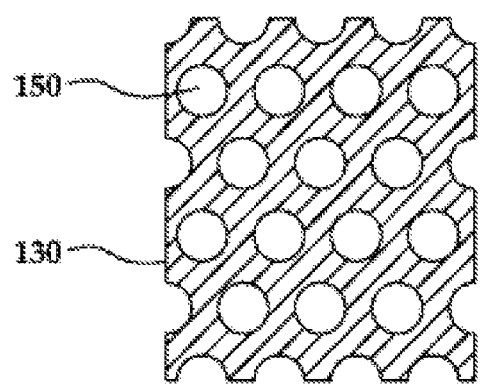
Figure 3E:
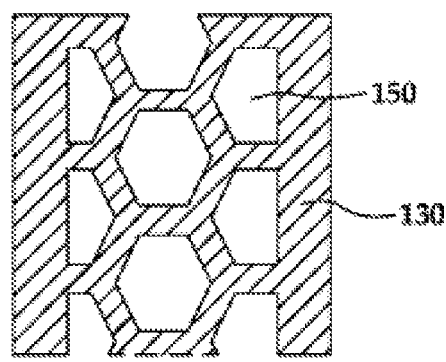

In another example, as illustrated in the example of FIG. 3D, the Zener region is configured to have a circular shape in which limited regions having N-type impurity injections are separated evenly apart and formed, or N-type impurity injected regions are formed having a circular shape separated evenly apart. Alternatively, as illustrated in FIG. 3E, region injected of N-type impurity and region limited of N-type impurity injection is formed having a honeycomb structure.

In the example of FIG. 2, the Zener region 150, which can be formed in various forms as aforementioned including respective vertical structures which are relevant to Zener region 150, is illustrated as being divided and separated evenly apart. However, actually, the Zener region 150 is formed through diffusion process after ion injected at a very small separation distance thereby, so Zener region can be formed connected with each other. An example Zener region 150 is illustrated further with reference to FIG. 4.

Figure 4:
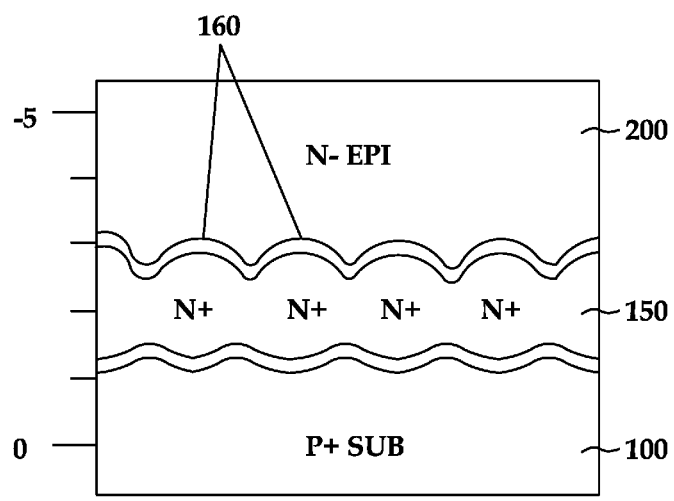
FIG. 4 is a diagram that illustrates a structure of a Zener region formed according to the example of FIG. 1.

FIG. 4 is a diagram illustrating a structure of a Zener region formed according to the example of FIG. 1.

As illustrated in the example of FIG. 4, FIG. 2 illustrates a structure wherein ions injected for a plurality of Zener regions 150 are differentiated. However, when a diffusion process is conducted after ion injection, an adjacent Zener region 150 forms in which the parts are connected with each other as in FIG. 4 due to a diffusion process, thereby a part in contact between the Zener regions 150 and a semiconductor substrate is formed in a wave junction 160 shape, not in a linear junction shape. In other words, in an ESD device according to the present invention, a region in contact between a Zener region 150 and a semiconductor substrate 100 is formed to have the wave shape 160, and thereby such a region becomes larger than an area of a conventional linear junction. Thus, a Zener diode 18 with a plurality of Zener regions 150 connected with each other is formed. Such a form connected with each other is the plurality of wave shaped Zener region 160 formed in convex waves in a direction of the substrate 100 and the epi-layer 200.

For example, the Zener diode 18 is formed between the Zener region 150 and P+ semiconductor 100, and such features of the Zener diode 18 commensurate with a size of such an area where the Zener region 150 and the semiconductor substrate 100 are in contact with each other.

Therefore, in the present examples, an area where the Zener region 150 and a semiconductor substrate 100 are in contact with each other is formed in a wave junction 160. Thereby, forming the Zener region 150 in such a manner improves ESD device features and thereby, it has the effect of providing the ability to prevent circuit damage due to an electrostatic discharge.

A first doping region 210 of P-type is formed on an upper region of a region formed with the semiconductor layer 130, wherein the first doping region 210 is configured on the upper side of the epi-layer 200. The first doping region 210 also potentially includes a first or a third diode 14, 20.

Likewise, a semiconductor layer 130 is formed on a lower region of a first doping region 210 so as to be included in a first or third diode 14, 20. Thereby, when a reverse voltage is applied between a semiconductor substrate 100 and Zener region 150, a depletion layer passes a semiconductor layer 130 and contacts with a first doping region 210 and is able to prevent a punch-through phenomenon which would incur a leakage current increase.

In the examples, the first doping region 210 is formed in two portions and each of the portions of a first doping region 210 is formed separated evenly apart. In an example, each portion of a first doping region 210 is formed separated evenly apart on an upper left region and an upper right region of the semiconductor layer 130.

A first blocking structure 230 is configured so as to surround the semiconductor layer 130, the Zener region 150 and a first doping region 210. For this purpose, the first blocking structure 230 passes through the epi-layer 200 and includes a trench configured to extend to a certain depth with respect to the semiconductor substrate 100 and an insulator formed in the trench interior.

Such a first blocking structure 230 separates the part of the epi-layer 200 that includes a first doping region 210 and the part of the epi-layer 200 that includes a second doping region 220. In other words, a first blocking structure 230 is able to separate between a first and a third diode 14, 20 located in one part of the epi-layer 200 and between a second and a fourth diode 15, 21 in a different part of the epi-layer 200.

In examples, the first blocking structure 230 is formed in various depths. For example, the first blocking structure 230 is deeper or of identical depth with an epi-layer surface of the Zener region 150.

As discussed, the second doping region 220 of N-type dopant is formed on an upper side of the epi-layer 200 which is an exterior region of a first blocking structure 230. The second doping region 220 of an N-type dopant can form respective second and fourth diodes 15, 21 in a manner similar to the first doping region 210.

Additionally, an ESD device that is applicable to the examples is formed on an upper side of the epi-layer 200 and includes a third doping region 240 that is doped with an N-type impurity that is formed on an upper region of the semiconductor layer 150. Further, in such an example, the third doping region 240 is configured between two regions of the first doping region 210 and is separated evenly apart with the two regions of the first doping region 210. Moreover, in an example, the third doping region 240 is formed to have an identical depth with the first doping region 210.

The third doping region 240 is configured to be situated between the two portions of the first doping region 210 and is able to prevent a formation of an inversion channel on a surface region of the epi-layer 200 when configured to be situated between a first and a third diode regions 14, 20. Moreover, the third doping region 240 potentially prevents formation of a parasitic transistor between the first doping region 210 and the epi-layer 200.

Additionally, for functional improvement in an ESD according to the examples, in an example, a second blocking structure 250, 260 that is configured to surround the second doping region 220 is further included. The second blocking structure 250, 260 is configured as including portions as illustrated in FIG. 2 and passes through the epi-layer 200 in a manner similar to the first blocking structure 230 and also includes an insulator formed in a trench configured to be extended at certain depths with respect to the interior trench.

Figure 5:
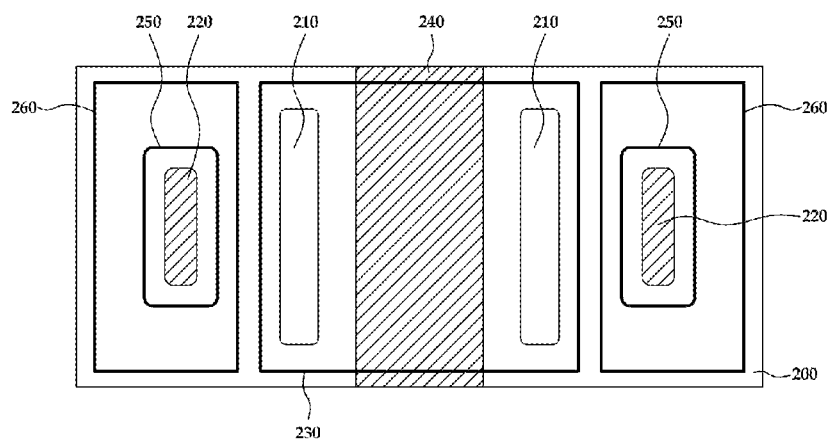
FIG. 5 is a top view of an ESD device according to an example.

FIG. 5 is a top view relating to an ESD device that includes second blocking structures 250, 260 that are configured to surround a second doping region 220 in an example.

As illustrated in the example of FIG. 5, an ESD device according to an example is formed wherein the first doping region 210 and the third doping region 240 are differentiated from the second doping region 220 through a first blocking structure 230 and second blocking structures 250, 260.

In an ESD device according to an example, a current cannot flow through a bottom side of the semiconductor substrate 100. Therefore, a bottom side of the semiconductor substrate 100 cannot configure an additional electrode.

Additionally, in another example, an ESD device 10 further includes a third terminal 17 which is illustrated using a dashed line in FIG. 1. In various examples, the third terminal 17 is electronically connected with ground reference voltage relating to a system using the ESD device 10.

In order to add the third terminal 17, electrode 330 that is illustrated in the example of FIG. 2 and is illustrated using a dashed line in FIG. 2 is situated on a lower side of a semiconductor substrate 100 and the third terminal 17 is be electronically connected with such an electrode 330.

FIG. 6A to 6D are diagrams illustrating an ESD device and method of fabricating the same according to another example.

Figure 6A:
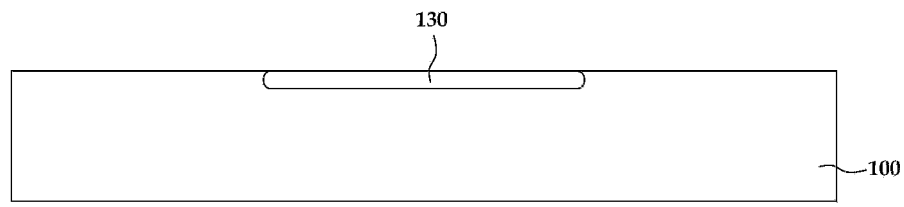
FIGS. 6A to 6D are diagrams illustrating a manufacturing method of an ESD device according to another example.

As illustrated in the example of FIG. 6A, a first stage of fabricating an ESD device is to prepare a P-type semiconductor substrate 100. The semiconductor substrate 100 is doped with P-type impurity such as boron. In an example, the semiconductor substrate 100 is configured to be boron-doped so as to have a concentration of more than 1e19 atoms/cm$^3$.

Additionally, an N-type semiconductor layer 130 is formed on one region of an upper side of such a P-type semiconductor substrate 100. For example, the semiconductor layer 130 is formed by ion-injecting an N-type impurity such as arsenide (As) and/or Phosphorus (P) and in an example, is formed by ion-injecting arsenide and/or phosphorus so as to have concentration of 1e16-1e18 atoms/cm$^3$. Moreover, an example provides that such a concentration is a concentration lower than that of a Zener region 150. Thus, it is induced for a Zener diode to be formed using the Zener region 150. Thus, a preferable concentration range is over 1e16 atoms/cm$^3$ and under 1e18 atoms/cm$^3$ to achieve this relationship and the associated functional effects. Afterwards, a process such as diffusion is added if relevant in order to ensure appropriate dopant concentrations.

Figure 6B:
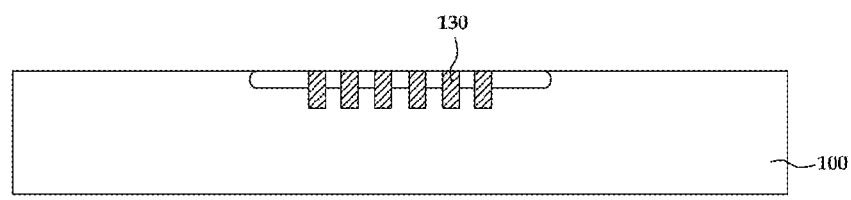

Moreover, as illustrated in the example of FIG. 6B, an N-type Zener region 150 is situated so as to overlap on the semiconductor layer 130 and semiconductor substrate 100. For example, various forms of N-type impurity are ion-injected, thereby forming Zener region 150 by using various mask patterns as illustrated in FIG. 3.

Herein, the Zener region 150 is formed by ion-injecting an N-type impurity in a dose of 1e15-2e16 atoms/cm$^2$. Afterwards, processes such as diffusion can be conducted if appropriate. In an example, the Zener region 150 is to have an identical or similar concentration with a semiconductor substrate 100 because the Zener region 150 is to have a relationship with the semiconductor substrate 100 such that the functionality of a Zener diode is provided. Thus, the Zener region 150 is configured to have a concentration of 1e18-1e20 atoms/cm$^3$. Thus, a Zener diode is not formed on a semiconductor layer 130 itself, but is formed instead through use of the Zener region 150. Moreover, in an example, a depth of the Zener region 150 is formed deeper than the semiconductor layer 130 in a direction of a semiconductor substrate.

Moreover, in this example, the Zener region 150 is configured to overlap on the semiconductor layer 130 and the semiconductor substrate 100 by forming a greater depth than the semiconductor layer 130.

Figure 6C:
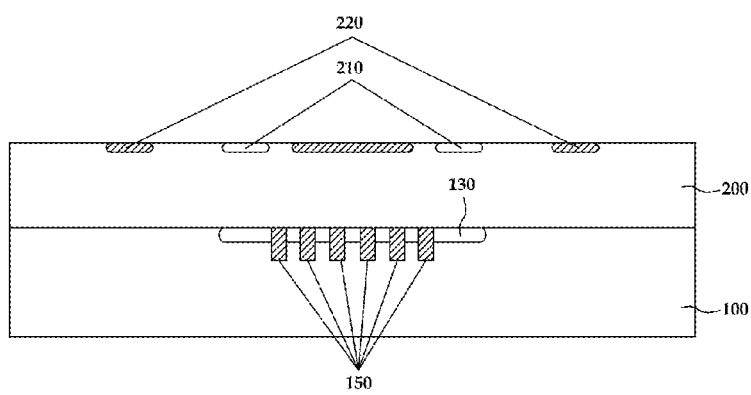

Additionally, as illustrated in FIG. 6C, an N-type epi-layer 200 is situated on the semiconductor substrate 100 and on an upper side of a semiconductor layer 130. The epi-layer 200 is formed through various means. In examples, the epi-layer 200 is formed to have an impurity concentration of 1e13-1e16 atoms/cm$^3$.

Moreover, a first doping region 210 and a second doping region 220 are formed on the epi-layer 200. In an example, the first doping region 210 is formed above an upper region of the semiconductor layer 130 and a second doping region 220 is formed on an upper region of a region not formed directly above the semiconductor layer 130. In other words, referring to the example of FIG. 6C, a first doping region 210 is situated on an upper side of an epi-layer 200 so as to be close to a center region and a second doping region 220 is formed on an upper side of epi-layer 200 so as to be situated at an exterior region of the first doping region 210.

Thus, the first doping region 210 is formed by ion injecting P-type impurity, such as boron B, in a dose amount of 1e15-1e16 atoms/cm$^2$ and the second doping region 220 is formed by ion injecting N-type impurity, such as phosphorus, in a dose amount of 1e15-1e16 atoms/cm². Afterwards, additional processes are conducted if appropriate. Therefore, a first doping region 210 and a second doping region 220 are formed to have concentrations of 1e18-1e20 atoms/cm³.

Additionally, in such an example, the semiconductor layer 130 is formed on an upper side of the epi-layer 200 that is an upper region of the semiconductor layer 130. For example, the third doping region 240 is formed between the first doping regions 210 and is formed to have an identical depth with a first doping region 210.

In this example, the third doping region 240 is formed using a process that is identical with a process for forming the second doping region 220. For example, the third doping region 240 is formed through an identical mask process). In another example, the third doping region 240 is configured through a distinct process from an identical process. For example, the second doping region 220 and the third doping region 240 are formed through two different masking processes. Thus, the third doping region 240 is formed so as to have a concentration of 1e18-1e20 atoms/cm³ as in the first doping region 210 and the second doping region 220.

Figure 6D:
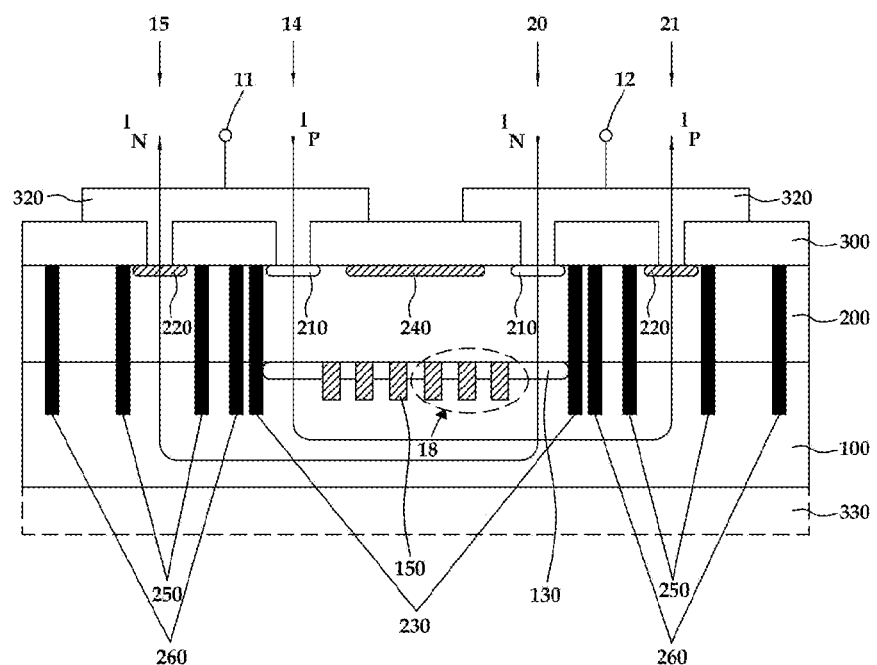

Moreover, as illustrated in the example of FIG. 6D, the examples include a first separation structure 230 that separates a first doping region 210 and a second doping region 220. Thus, in a step that comprises the first separation structure 230, the first separation structure 230 forms a trench that extends from the upper side of the epi-layer 200 and passes through the epi-layer 200. Such a trench extends to one portion of the semiconductor substrate 100 and, optionally includes a feature in which an insulator is included in the trench interior.

In an example, the first separation structure 230 is formed on the Zener region 150 and extends to an identical depth or deeper. For example, said first separation structure 230 surrounds a first doping region 210, semiconductor layer 130, and Zener region 150. The first separation structure 230 separates portions of the epi-layer 200, including separating epi-layer 200 regions that include a first doping region 210 and a second doping region 220.

Additionally, in the example of FIG. 6D, a second separation structure 250, 260 is configured so as to surround the second doping region 220. The second separation structure 250, 260 is formed through a similar method to that used to create the first separation structure 230.

Additionally, in the example of FIG. 6D, an insulator film 300 is formed on an upper side of the epi-layer 200. In an example, the insulator film 300 is only formed on one region from among regions of an upper side of the epi-layer 200. Thus, such an insulator film 300 is formed so as to expose surface portions of an epi-layer 200 where the first doping region 200 and the second doping region 220 are intended to be formed.

Further, electrodes 310, 320 are formed on an upper portion of the insulator film 300 and act to electronically connect the first doping region 210 and the second doping region 220. Further, an electrode 310, 320 is differentiated as being a left side or right side or a right side electrode according to a center of a third doping region 240. Electrode 310 electronically connects a first doping region 210 and a second doping region 220 and, electrode 320 also electronically connects a first doping region 210 and second doping region 220. Also, the electrodes 310, 320 are connected with terminals 11, 12 respectively.

An ESD device and method of fabricating the same of examples includes a second conductive-type semiconductor layer on a region that is in contact between a first conductive-type semiconductor substrate and a second conductive-type epi-layer. Moreover, the present invention includes a Zener region of a second conductive-type configured to overlap on the semiconductor layer and a semiconductor substrate, and thereby has the improved feature of a Zener diode with lower capacitance value than alternatives.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electrostatic discharge (ESD) device comprising:
a first conductivity-type semiconductor substrate;
a second conductivity-type epi-layer situated on the first conductivity-type semiconductor substrate;
a second conductivity-type semiconductor layer situated on a region among regions located between the first conductivity-type semiconductor substrate and the second conductivity-type epi-layer;
a second conductivity-type Zener region overlapping on the second conductivity-type semiconductor layer and the first conductivity-type semiconductor substrate, situated in a region and spaced apart from an upper side of the second conductivity-type epi-layer;
a first conductivity-type first doping region situated on the upper side of the second conductivity-type epi-layer and an upper region of the second conductivity-type semiconductor layer;
a first blocking structure surrounding the second conductivity-type semiconductor layer, the second conductivity-type Zener region, and the first conductivity-type first doping region;
a second conductivity-type second doping region situated on the upper side of the second conductivity-type epi-layer at an exterior region of the first blocking structure,
wherein the second conductivity-type Zener region extends across the first conductivity-type semiconductor substrate starting from a lower side of the second conductivity-type epi-layer to a greater depth than a lower side of the second conductivity-type semiconductor layer, and
wherein an upper side of the second conductivity-type Zener region is coplanar with the lower side of the second conductivity-type epi-layer.

2. The ESD device of claim 1, wherein a doping concentration of the second conductivity-type semiconductor layer is greater than a doping concentration of the second conductivity-type epi-layer.

3. The ESD device of claim 1, wherein a doping concentration of the second conductivity-type Zener region is greater than a doping concentration of the second conductivity-type semiconductor layer.

4. The ESD device of claim 1, wherein the second conductivity-type Zener region comprises vertical structures that overlap the second conductivity-type semiconductor layer and the first conductivity-type semiconductor substrate that are isolated from one another by being spaced evenly across the second conductivity-type semiconductor layer.

5. The ESD device of claim 4, wherein a lower side of the second conductivity-type Zener region has a wave shape.

6. The ESD device of claim 1, further comprising:
a third doping region of a second conductivity-type situated on the upper side of the second conductivity-type epi-layer and the upper region of the second conductivity-type semiconductor layer.

7. The ESD device of claim 6, wherein the first conductivity-type first doping region and the second conductivity-type second doping region are situated to be spaced apart from each other and the first conductivity-type first doping region is situated between the third doping region of the second conductivity-type and the second conductivity-type second doping region.

8. The ESD device of claim 1, further comprising:
a second blocking structure that surrounds the second conductivity-type second doping region.

9. The ESD device of claim 1, further comprising:
an insulator layer situated on a region of the upper side of the second conductivity-type epi-layer; and
an electrode situated on the insulator layer that electronically links the first conductivity-type first doping region and the second conductivity-type second doping region.

10. An electrostatic discharge (ESD) device, comprising:
a semiconductor layer situated between a semiconductor substrate and an epi-layer situated on the semiconductor substrate;
a Zener region overlapping on the semiconductor layer and the semiconductor substrate, situated in a region and spaced apart from an upper side of the epi-layer;
a first doping region situated on the upper side of the epi-layer and an upper region of the semiconductor layer;
a first blocking structure surrounding the semiconductor layer, the Zener region, and the first doping region;
a second doping region situated on the upper side of the epi-layer at an exterior region of the first blocking structure; and
a second blocking structure comprising two concentric portions, each portion surrounding the second doping region,
wherein the epi-layer, the semiconductor layer, the Zener region, and the second doping region are of an opposite conductivity-type to that of the semiconductor substrate and the first doping region, and
wherein a bottom surface of the Zener region is disposed between a bottom surface of the semiconductor layer and a bottom surface of the first blocking structure.

11. The ESD of claim 10, wherein the semiconductor layer overlaps with the first doping region and the Zener region does not overlap with the first doping region and the second doping region.

12. The ESD device of claim 11, wherein a doping concentration of the semiconductor layer is greater than a doping concentration of the epi-layer.

13. The ESD device of claim 11, wherein a doping concentration of the Zener region is greater than a doping concentration of the semiconductor layer.

14. The ESD device of claim 6, wherein the second conductivity-type Zener region overlaps with the third doping region of the second conductivity type.

15. An electrostatic discharge (ESD) device, comprising:
a semiconductor layer situated between a semiconductor substrate and an epi-layer situated on the semiconductor substrate;
a Zener region overlapping on the semiconductor layer and the semiconductor substrate, situated in a region and spaced apart from an upper side of the epi-layer;
a first doping region situated on the upper side of the epi-layer and an upper region of the semiconductor layer;
a first blocking structure surrounding the semiconductor layer, the Zener region, and the first doping region; and
a second doping region situated on the upper side of the epi-layer at an exterior region of the first blocking structure,
wherein the epi-layer, the semiconductor layer, the Zener region, and the second doping region are of an opposite conductivity-type to that of the semiconductor substrate and the first doping region, and
wherein the Zener region extends into the semiconductor substrate from a lower side of the epi-layer to a greater depth than a lower side of the semiconductor layer, and an upper side of the Zener region is coplanar with the lower side of the epi-layer.

16. The ESD device of claim 10, further comprising:
a third doping region situated on the upper side of the epi-layer and the upper region of the semiconductor layer.

17. The ESD device of claim 16, wherein the Zener region overlaps with the third doping region.

* * * * *